(12) United States Patent
Sasaki et al.

(10) Patent No.: US 7,619,223 B2
(45) Date of Patent: Nov. 17, 2009

(54) BEAM CURRENT MEASURING INSTRUMENT AND BEAM CURRENT MEASURING METHOD USING SAME

(75) Inventors: Yuichiro Sasaki, Machida (JP); Bunji Mizuno, Ikoma (JP); Kichiji Hatanaka, Ibaraki (JP); Takeshi Katayama, Wako (JP); Tamaki Watanabe, Wako (JP)

(73) Assignees: Panasonic Corporation, Osaka (JP); Riken, Saitama (JP)

( * ) Notice: Subject to any disclaimer, the term of this patent is extended or adjusted under 35 U.S.C. 154(b) by 511 days.

(21) Appl. No.: 10/549,251

(22) PCT Filed: Mar. 12, 2004

(86) PCT No.: PCT/JP2004/003319

§ 371 (c)(1),
(2), (4) Date: Jun. 5, 2006

(87) PCT Pub. No.: WO2004/081966

PCT Pub. Date: Sep. 23, 2004

(65) Prior Publication Data

US 2006/0237660 A1  Oct. 26, 2006

(30) Foreign Application Priority Data

Mar. 14, 2003 (JP) ............................. 2003-071028

(51) Int. Cl.
*G01K 1/08* (2006.01)
(52) U.S. Cl. ............... 250/397; 250/492.21; 324/117 R
(58) Field of Classification Search .................. 250/397
See application file for complete search history.

(56) References Cited

U.S. PATENT DOCUMENTS

| 5,113,074 A | * | 5/1992 | Sferlazzo | ................ 250/492.2 |
| 5,285,155 A | * | 2/1994 | Ueda et al. | .................. 324/248 |
| 6,320,369 B1 | * | 11/2001 | Hidaka et al. | ........... 324/117 R |

FOREIGN PATENT DOCUMENTS

| JP | 2001-91611 | 4/2001 |
| JP | 2003-21670 | 1/2003 |
| JP | 2003-31176 | 1/2003 |

OTHER PUBLICATIONS

Grohmann et al., "A Cryodevice for Induction Monitoring of DC Electron or Ion Beams with Nano-Ampere Resolution", Physikalisch-Technische Bundesanstalt, Berlin, Germany.

(Continued)

*Primary Examiner*—David A. Vanore
*Assistant Examiner*—Phillip A. Johnston
(74) *Attorney, Agent, or Firm*—Pearne & Gordon LLP (57) ABSTRACT

The invention provides a nondestructive measuring method and measuring apparatus that assures a high noise immunity and is capable of performing high-accuracy beam current measurements. The inventive beam current measuring apparatus includes a magnetism shielding part for shielding an external magnetic field and a magnetic field sensor arranged in the shielding space generated by said magnetism shielding part, said beam current measuring apparatus measuring, by using said magnetic field sensor, a magnetic field where a beam current to be measured is generated, characterized in that said magnetic field sensor has a magnetic flux/feedback current conversion coefficient of $8 \times 10^{-15}$ Wb/A or above.

19 Claims, 3 Drawing Sheets

OTHER PUBLICATIONS

Hao et al., "Design and Performance of an HTS Current comparator for Charged-Particle-Beam Measurements", IEE Transactions of Applied Superconductivity, vol. 11, No. 1, Mar. 2001.

Peters et al., "Review of the Experimental Results with a Cryogenic Current Comparator", University of Jena, Germany.

Kuchnir et al., "Squid Based Beam Current Meter", IEE Transactions on Magnetics, vol. MAG-21, No. 2, Mar. 1985.

Tanabe, "A Cryogenic Current-Measuring Device with Nano-Ampere Resolution at the Storage Ring TARN II", Sep. 1998, pp. 455-464.

Hao et al., "HTS Flux Concentrator For Non-Invasive Sensing Of Charges Particle Beams", Jun. 2001, pp. 469-470.

* cited by examiner

BEAM CURRENT MEASURING INSTRUMENT AND BEAM CURRENT MEASURING METHOD USING SAME

TECHNICAL FIELD

The present invention relates to beam current measuring apparatus and a beam current measuring method using the same and in particular to apparatus that accurately measures a beam current value without cutting off an ion beam.

BACKGROUND ART

There is known a research report on a method for accurately measuring an ion beam current value without cutting off ion beams (refer to non-patent document 1). This method uses a sensor called SQUID that employs a Josephson junction device as a highly sensitive magnetic field sensor to detect a magnetic field generated by a beam current and measure the resulting beam current value. SQUID has a superconducting ring structure where two Josephson junctions are arranged in parallel and measures the magnetic flux that passes through the superconducting ring on the scale of the magnetic flux quantum ($2.07 \times 10^{-15}$ Wb).

In the above document, SQUID uses a low-temperature superconductor operating at a liquid helium temperature or below. The main section of the beam current measuring apparatus comprises: a detection part for detecting a magnetic field corresponding to a beam current; a magnetic flux transmission part for transmitting magnetic flux to a measuring part; a measuring part including a superconducting device and a feedback coil supplying a feedback current to cancel a change in the magnetic flux passing through the superconducting device; and a magnetism shielding part having a gap composed of a superconductor magnetically shielding the detection part and the measuring part from external space including ion beam flowing space.

The detection part that is a coil including a superconducting wire wound around a core of a soft magnetic material collects, by using the core of a soft magnetic material, a magnetic field generated by a beam current and induces a superconducting current on the coil.

The superconducting current induced on the coil is transmitted to a coil arranged adjacently to the SQUID. The superconducting current flowing through the coil changes as the beam current changes, thus causing a change in the magnetic flux amount passing through the SQUID. The detection part applies a feedback current to a feedback coil to cancel the change in the magnetic flux amount passing through the SQUID. The feedback current is proportional to a change in the beam current value. It is thus possible to determine the amount of change in the beam current value by measuring the feedback current.

Recently, there has been a research on a method for measuring a beam current value using a high-temperature superconductor (refer to non-patent document 2). According to the method disclosed in this document, a cylinder whose surface is coated with a high-temperature superconductor is used as a detection part, with only a portion of the outer peripheral surface of the cylinder including a bridge part of the high-temperature superconductor. A beam current that passes through the center of the cylinder induces a surface shielding current on the surface of the cylinder. The surface shielding current is concentrated on the bridge part. Magnetic flux generated by the concentrated surface shielding current is thus measured using the SQUID. The SQUID employed in this method uses a high-temperature superconductor and operates at a liquid nitrogen temperature or above.

Beam current measuring apparatus using the low-temperature superconducting SQUID can measure a beam current with a noise width of several nanoamperes.

Beam current measuring apparatus using the high-temperature superconducting SQUID is advantageous in that it operates using liquid nitrogen or a chiller although its noise width is as wide as several microamperes (refer to non-patent document 3). This apparatus shows a large drift of the zero point and measures only a beam current equivalent to 10 μA or above in actual measurements of several tens of seconds or above.

Another nondestructive measuring method is a direct-current transformer. This approach, however, shows a noise width equivalent to several microamperes. Considering the drift of the zero point, measurement of a beam current below 10 μA is practically difficult.

[Non-patent document 1] "Super Conducting Quantum Interference Devices and Their Applications" (Walter de Gruyter, 1977) p. 311, IEEE TRANSACTIONS ON MAGNETICS, VOL. MAG-21, BO. 2, MARCH 1985, Proc. 5th European Particle Accelerator Conf., Sitges, 1996 (Institute of Physics, 1997) p. 1627, Journal of the Physical Society of Japan Vol. 54, No. 1, 1999.

[Non-patent document 2] IEEE TRANSACTION ON APPLIED SUPERCONDUCTIVITY, VOL. 11, NO. 1, MARCH 2001 P.635

[Non-patent document 3] IEEE TRANSACTION ON APPLIED SUPERCONDUCTIVITY, VOL. 11, NO. 1, MARCH 2001 P.635

DISCLOSURE OF THE INVENTION

As mentioned above, beam current measuring apparatus using a low-temperature superconducting SQUID has a high sensitivity although it is highly susceptible to noise. An external electromagnetic field or mechanical vibration causes noise. Thus, a variety of attempts have been made by a large number of researchers to strength the shielding effect to completely shield an external electromagnetic field and mechanical vibration.

In the process of research efforts, it has been found that the noise immunity attained is limited even when an electromagnetic field or mechanical vibration is almost completely shielded. Such noise could unlock the SQUID (dislocate the measuring point of the SQUID). When the SQUID is unlocked, measurement is no longer continuous leading to inaccurate measurements<which presents a serious problem.

Beam current measuring apparatus using a high-temperature superconducting SQUID has a low sensitivity and a large drift of the zero point, so that it can measure only a beam current equivalent to 10 μA or above in the actual measurement practices. The noise width is several microamperes even in short-time measurements where the drift of the zero point is negligible, and a fainter beam current is difficult to measure.

Another nondestructive measuring method, a direct-current transformer, is actually impractical in measurements of a beam current below 10 μA, considering the drift of the zero point. The noise width is several microamperes even in short-time measurements where the drift of the zero point is negligible.

Under such situations, there is a need for beam current measuring apparatus and a beam current measuring method that measure a beam in a nondestructive fashion and allow high-accuracy measurement. More precisely, there is a need for a nondestructive beam current measuring method and beam current measuring apparatus featuring an improved noise immunity that is capable of stably measuring a faint beam current at a noise width of 10 μA or below, or desirably several microamperes or below while maintaining the continuity of measurement.

The invention has been accomplished in view of the above circumstances. An object of the invention is to provide beam current measuring apparatus that is highly immune to noise and has a high sensitivity.

Another object of the invention is to provide beam current measuring apparatus that can be possibly used at normal temperatures.

In order to attain these objects, the invention provides beam current measuring apparatus comprising a magnetism shielding part for shielding an external magnetic field and a magnetic field sensor arranged in the shielding space generated by the magnetism shielding part, the beam current measuring apparatus measuring, by using the magnetic field sensor, a magnetic field where a beam current to be measured is generated, characterized in that the magnetic field sensor has a magnetic flux/feedback current conversion coefficient of $8\times10^{-15}$ Wb/A or above.

The inventors have found that the noise immunity is dramatically improved by using an area for sensor sensitivity other than that used in the related art based on a variety of experiment results using a normal conductor and a low-temperature superconductor and a high-temperature superconductor. The invention has been accomplished focusing on this finding.

According to thee invention, the noise immunity is dramatically improved by the use of a magnetic field sensor having a magnetic flux/feedback current conversion coefficient of $8\times10^{-15}$ Wb/A or above.

With this configuration, it is possible to provide beam current measuring apparatus that has a high noise immunity and is capable of measuring a beam current with a noise width of several tens of nanoamperes to 10 microamperes.

By using a magnetic field sensor having a magnetic flux/feedback current conversion coefficient of $2\times10^{-12}$ Wb/A or below, the area is provided where the noise immunity is favorable and the noise width is small in measurements.

Desirably, the magnetic field sensor has a magnetic flux/feedback current conversion coefficient of $1\times10^{-12}$ Wb/A or below. This is because measurements with a smaller noise width are allowed.

The invention provides beam current measuring apparatus comprising a magnetism shielding part for shielding an external magnetic field and a magnetic field sensor arranged in the shielding space generated by the magnetism shielding part, the beam current measuring apparatus measuring, by using the magnetic field sensor, a magnetic field where a beam current to be measured is generated, characterized in that the magnetic field sensor has a magnetic flux sensitivity of $2\times10^{-18}$ Wb/V or above.

By the use of such a magnetic field sensor, the noise immunity is substantially improved.

Desirably, the magnetic field sensor has a magnetic sensitivity of $5\times10^{-15}$ Wb/V or below.

Desirably, the magnetic field sensor has a magnetic flux sensitivity of $2\times10^{-15}$ Wb/V or below.

Desirably, the magnetic field sensor has a superconducting ring structure of two Josephson junctions arranged in parallel.

The magnetic field sensor is called SQUID. The ratio of a feedback signal flowing through a feedback coil to a change in the amount of magnetic flux passing through the SQUID is defined as a magnetic flux/feedback current conversion coefficient.

The ratio of an output to a change the amount of magnetic flux passing through the SQUID is defined as a magnetic flux sensitivity.

A SQUID whose magnetic flux/feedback current conversion coefficient is $2.95\times10^{-13}$ Wb/A and whose magnetic flux sensitivity is around $5.9\times10^{-16}$ Wb/V is manufactured using a high-temperature superconductor.

It is desirable to use a high-temperature superconductor because it operates above a liquid nitrogen temperature.

The high-temperature superconductor refers to a substance that shows superconductivity at 10 K or above. Desirably, the high-temperature superconductor refers to a substance that shows superconductivity at 30 K or above. By the use of such a high-temperature superconductor, the running cost of the system is reduced and the entire apparatus may be downsized because the shielding part has a lower profile.

The magnetic field sensor desirably comprises a magnetism shielding part of a superconductor for magnetically shielding the SQUID from external space including space where an ion beam flows. This is because the external magnetic field is shielded to reduce possible noise.

The magnetism shielding part desirably comprises a gap because the external magnetic field is reduced while only a magnetic field generated by a beam is selectively transmitted.

The magnetic field sensor desirably comprises an electric field shielding part and an electromagnetic field shielding part. This is because an external electric field and electromagnetic field that varies in the shape of a pulse or at high frequencies are shielded to improve the stability of measurement.

The magnetic field sensor desirably comprises a mechanism for collecting a magnetic field generated by a beam current to be measured.

the mechanism for collecting a magnetic field is desirably a coil including a superconducting wire wound around a core of a soft magnetic material or a cylinder whose surface is coated with a high-temperature superconductor, the cylinder including a bridge part that is partially a high-temperature superconductor.

The electric field shielding part and the electromagnetic field shielding part is made of a material including at least one metal selected from a group of copper and aluminum. This is because an eddy current is likely to occur thus efficiently canceling an electric field and an electromagnetic field.

By applying the invention to ion implantation apparatus that is required to measure a beam current of several microamperes to several nonoamperes, it is possible to nondestructively measure a beam current while irradiating an ion beam onto a semiconductor wafer.

A beam current measuring method according to the invention uses the above beam current measuring apparatus, characterized by arranging a magnetic field sensor of the beam current measuring apparatus on a beam line irradiated from an ion source or an electron ray source onto the surface of a processed substance in order to measure the beam current value of the beam line from the output of the magnetic field sensor.

A beam irradiation method according to the invention comprises a measuring step of measuring, by using the above beam current measuring method, a beam current of a beam generated using an ion source or an electron ray source, a control step of feeding back the beam current value obtained in the measuring step to the control parameter of the ion source or electron ray source, and an irradiating step of irradiating a beam current onto a processed substance, the beam current controlled using the control parameter obtained in the control step.

According to a beam irradiation apparatus using the above beam current measuring apparatus, it is possible perform beam irradiation while accurately controlling a beam current. This ensures high-accuracy processing.

An active element such as a semiconductor, a liquid crystal and a bio-chip and a passive element such as a resistor, a coil and a capacitor are also effective, the elements manufactured or inspected using ion implantation apparatus, electron beam exposure apparatus or accelerating apparatus comprising the above beam current measuring apparatus.

BRIEF DESCRIPTION OF THE DRAWINGS

In the drawings, a numeral 1 represents a detecting coil, 2 SQUID, 3 a feedback coil, 4 a feedback resistor, 5 a SQUID input coil, 6 a washer coil 1 and 7 an output.

BEST MODE FOR CARRYING OUT THE INVENTION

Embodiments of the invention will be detailed referring to drawings.

Embodiment 1

Figure 1:
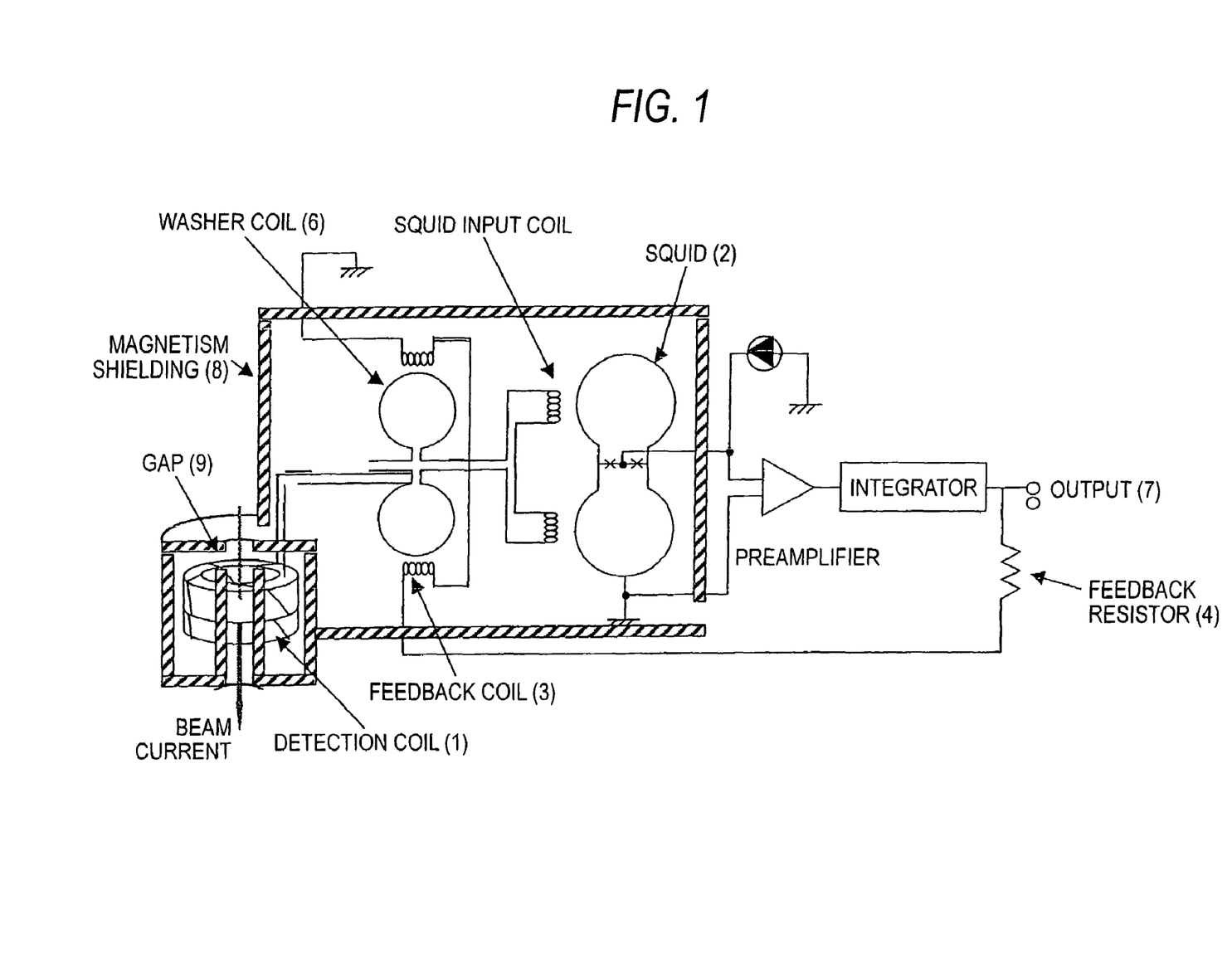
FIG. 1 shows beam current measuring apparatus according to an embodiment of the invention.

FIG. 1 is an explanatory drawing of a beam current measuring apparatus according to an embodiment of the invention.

As shown in FIG. 1, the beam current measuring apparatus comprises: a detection coil 1 arranged in the path of a beam to be detected; a SQUID 2 working as a magnetic field sensor for detecting a magnetic field corresponding to a beam current; a washer coil 6 working as a magnetism transmission part for transmitting magnetic flux detected by the detection coil 1 to a measuring part; and a measuring part including a superconducting element sensitive to the transmitted magnetic flux, a feedback coil 3 for applying a feedback current so as to cancel a change in the magnetic flux passing through the superconducting element, a SQUID input coil 5 and a SQUID 2. The beam current measuring apparatus is arranged to guide the output of the SQUID 2 to an output terminal 7 via a preamplifier and an integrator as well as feeding back the output to the feedback coil 3 via the feedback resistor 4.

The main section of the beam current measuring apparatus comprises: a magnetism shielding part having a gap composed of a superconductor magnetically shielding the magnetic field sensor 2 from external space including ion beam flowing space. The detection coil 1 is a coil including a superconducting wire wound around a core of a soft magnetic material. The detection coil 1 collects, by using the core of a soft magnetic material, a magnetic field generated by a beam current and induces a superconducting current on the coil. The superconducting current induced on the coil is transmitted to a coil arranged adjacently to the SQUID 2. The superconducting current flowing through the coil changes as the beam current changes, thus causing a change in the magnetic flux amount passing through the SQUID. The detection part applies a feedback current to a feedback coil to cancel the change in the magnetic flux amount passing through the SQUID. The feedback current is proportional to a change in the beam current value. It is thus possible to determine the amount of change in the beam current value by measuring the feedback current.

A numeral 8 represents a magnetism shielding part and 9 a gap. Presence of the cap allows output of the magnetic field sensor in a desired direction. A voltage generated across the feedback resistor 4 by the feedback current is monitored as the output 7 by an oscilloscope. The magnetism shielding part is a superconducting magnetism shielding part with a gap made of lead. The gap is arranged in seven stages in a nested shape. The detection coil 1 and the SQUID 2 are arranged in the magnetism shielding part. The magnetic field generated by the beam current to be measured reaches the detection coil I through the gap. Desirably, the shielding body includes an electricity shielding feature on top of the magnetism shielding part 8.

In this example, a pseudo-current is applied to a one turn coil wound instead of an ion beam to perform experiment.

This beam current measuring apparatus uses a SQUID having a magnetic flux/feedback current conversion coefficient of $2.95 \times 10^{-13}$ Wb/A and a magnetic flux sensitivity of $5.9 \times 10^{-16}$ Wb/V as a magnetic field sensor 2 as well as a drive circuit. The magnetic flux/feedback current conversion coefficient and the magnetic flux sensitivity are higher by two orders of magnitude than those of the beam current measuring apparatus that uses a high-temperature superconductor described in the non-patent document 1 (described later as Comparison Example 1) and lower by two orders of magnitude than those of the beam current measuring apparatus that uses a low-temperature superconductor, the beam current measuring apparatus having the same arrangement as that created by the inventors (described later as Comparison Example 2). The remaining conditions are the same as those for related art beam current measuring apparatus (Comparison Example 1).

The preservation rule of a magnetic flux satisfied by the superconducting closed circuit of the SQUID 2 is $Mis \cdot Ip + Mfs \cdot If = 0$, where Mis is a mutual conductance of the SQUID input coil 5 and the SQUID 2, Ip is a superconducting current flowing in a superconducting closed circuit including the detection coil 1, the washer 6 and the SQUID 5 input coil n5, MFs a mutual conductance of the feedback coil 3 and the SQUID 2, and If a feedback current flowing in the feedback coil 3. The magnitude of the feedback resistor is Rf. The first term is a magnetic flux input to the SQUID 2 and $If \cdot Rf$ is a voltage of the output 7. Thus, the magnetic flux sensitivity is obtained by dividing $Mis \cdot Ip$ by $If \cdot Rf$. The magnetic flux/feedback current conversion coefficient is obtained by dividing $Mis \cdot Ip$ by If.

The beam current/voltage conversion coefficient can be estimated as $1.5 \times 10^{-4}$ A/V. That is, an output with respect to the pseudo-current can be estimated as around 0.67 mV/100 nA. A noise width can be reduced to some 2 mV from Comparison Example 1. This value is equivalent to a pseudo-current of around 300 nA.

In this way, according to Comparison Example 1 of the invention, it is possible to measure a beam current with a noise width of around 300 nA.

Embodiment 2

The mechanism for collecting a magnetic field has a cylindrical structure whose surface is coated with a high-temperature superconductor and whose outer periphery has a bridge part partially including a high-temperature superconductor. When a beam passes through a closed curved surface created by the inner diameter of the cylindrical structure, a magnetic field generated by the beam induces a surface shielding current on the inner wall surface of the cylindrical structure. The surface shielding current flows in a direction opposite to the beam traveling direction on the inner wall surface of the cylindrical structure. The surface shielding current flows in the forward direction of the traveling of beam on the outer wall surface thus making one turn. The outer wall surface of the cylindrical structure has a bridge part that partially includes a high-temperature superconductor and the remaining part including a slit part S. Thus, a current does not flow in an exposed part of a base material that is an insulator or a normal conductor, which concentrates a surface shielding current on the bridge part. In this way, a magnetic field generated by a beam current to be measured is collected. The magnetic field generated on the bridge part by the concentrated surface shielding current is detected by the detection coil and then measured by the SQUID.

In this apparatus, a beam current passing though the cylindrical structure whose surface is coated with a high-temperature superconductor and whose outer periphery has a bridge part partially including a high-temperature superconductor induces a surface shielding current on the surface of the cylinder. The surface shielding current is concentrated on the bridge part. Magnetic flux generated by the concentrated surface shielding current is thus measured using the SQUID.

The SQUID employed in this method uses a high-temperature superconductor and operates at a liquid nitrogen temperature or above. The SQUID is arranged in extreme proximity to the bridge part so as to minimize the leakage of a magnetic field generated by the surface shielding current concentrated on the bridge part.

The beam current measuring apparatus uses as a magnetic field sensor a high-temperature SQUID whose magnetic flux/feedback current conversion coefficient is $2.95 \times 10^{-13}$ Wb/A and whose magnetic flux sensitivity is $5.9 \times 10^{-16}$ Wb/V and also uses a drive circuit. In other words, the beam current measuring apparatus comprises a magnetic field sensor having the same magnetic flux/feedback current conversion coefficient and magnetic flux sensitivity as Comparison Example 1.

Same as Comparison Example 1, an output with respect to the pseudo-current can be estimated as around 0.67 mV/100 nA. A noise width can be reduced to some 2 mV from Comparison Example 1. This value is equivalent to a pseudo-current of around 300 nA.

With this arrangement, it is possible to provide a beam current monitor whose member is a high-temperature superconductor, not a low-temperature superconductor such as lead, the beam current monitor showing a high sensitivity and noise immunity in a temperature area closer to normal temperatures.

Next comparison examples will be described.

Comparison Example 1

An experiment was conducted using a SQUID (B) of a high-temperature superconductor and a drive circuit. The detection part used a cylinder whose surface was coated with a high-temperature superconductor. As mentioned in the description of the related art, a bridge part partially including a high-temperature superconductor is provided on the outer peripheral surface of the cylinder and the magnetic flux generated by a surface shielding current concentrated on the bridge part was measured by a SQUID and a drive circuit. The magnetic flux/feedback current conversion coefficient of the high-temperature SQUID (B) and the drive circuit used in Comparison Example 1 is $1.15 \times 10^{-11}$ Wb/A and the magnetic flux sensitivity is $3.84 \times 10^{-14}$ Wb/V.

In this example also, a pseudo-current was applied to a one turn coil wound instead of an ion beam to perform experiment. The pseudo-current was produced by applying a current to the one turn coil wound so as to pass around the area above the axis of a beam passing hole of the beam current measuring apparatus. A pseudo-current of 1 mA produced an output of 40 mV.

That is, the beam current/voltage conversion coefficient was $2.5 \times 10^{-2}$ A/V. The noise width is around 2 mV This is equivalent to around 50 µA.

As understood from the above, it is not possible to measure a beam current with a noise width of several microamperes or below. On the other hand, SQUID is not unlocked by noise, which assures stable measurement.

Comparison Example 2

An experiment was conducted using a SQUID of a high-temperature superconductor and a drive circuit. The apparatus used has the same arrangement as that in the embodiment of the invention shown in FIG. 1 with only a magnetic field sensor being different. In Comparison Example 2, the magnetic flux sensitivity is $1.8 \times 10^{-18}$ Wb/A, which is higher by two orders of magnitude than the embodiment. The magnetic flux/feedback current conversion coefficient is $8.46 \times 10^{-15}$ Wb/A, which is higher by two orders of magnitude than the embodiment. In this case, the output 7 with respect to the pseudo-current was 40 mV.

In an experiment where a transformer was provided to maximize the magnetic flux transmissibility between the detection part and the measuring part, the output 7 with respect to the pseudo-current of 10 nA was 70 mV That is, the beam current/voltage conversion coefficient is $1.4-2.5 \times 10^{-7}$ AV. The noise width is around 10 mV, almost the same in both cases. The noise width is equivalent to 1.4-2.5 nA, allowing a beam current to be measured with a noise width equivalent to several nanoamperes. This arrangement is susceptible to noise and SQUID could be unlocked. In this example also, the magnetism, the external electric field and mechanical vibration are shielded to reduce the frequency the SQUID is unlocked. Stable measurement is a problem for use of this apparatus on a general manufacturing line.

External noise that could unlock the SQUID in Comparison Example 2 is a pulse noise whose magnetic flux variation per unit time is large. When the magnetic flux variation per unit time exceeds the limit of the follow-up property of the drive circuit, the SQUID is unlocked.

In order to cope with this, the embodiment uses a SQUID and a drive circuit whose magnetic flux sensitivity is lower by two orders of magnitude than that in Comparison Example 2. This unlocks the SQUID only in the presence of external noise whose magnetic flux variation per unit time is larger by two orders of magnitude. Note that the frequency of external noise whose magnetic flux variation per unit time is larger by two orders of magnitude is extremely small, or smaller by at least two orders of magnitude.

Further, external noise whose magnetic flux variation per unit time is larger by two orders of magnitude has a source that is relatively easy to locate. It is thus easy to take measures such as reducing the generation of electromagnetic field noise from the noise source or remove a specific noise source. This will suppress the frequency of external noise whose magnetic flux variation per unit time is larger by two orders of magnitude to virtually zero.

Pulse-shaped external noise having a flux variation per unit time small enough to keep the SQUID locked can be removed from the output signal by using a low-pass filter of an appropriate cutoff frequency and thus is less problematic. From the above, the SQUID remains locked in the presence of noise, thereby allowing stable measurement.

The relationship between the embodiment and Comparison Examples 1 and 2 is shown in Table 1.

TABLE 1

|  | (Comparison Example 1) | (Embodiment of the invention) | (Comparison Example 2) |
|---|---|---|---|
| Magnetic field resolution | 1 pT/$\sqrt{Hz}$ | 34 fT/$\sqrt{Hz}$ | 10 fT/$\sqrt{Hz}$ |
| Magnetic flux sensitivity | $3.84 \times 10^{-14}$ Wb/V | $5.9 \times 10^{-16}$ Wb/V | $1.8 \times 10^{-18}$ Wb/V |
| Magnetic flux/feedback current conversion coefficient | $1.15 \times 10^{-11}$ Wb/A | $2.95 \times 10^{-13}$ Wb/A | $8.46 \times 10^{-15}$ Wb/A |
| Beam current/voltage conversion coefficient | $2.5 \times 10^{-2}$ A/V | $1.5 \times 10^{-4}$ A/V | $1.4$~$2.5 \times 10^{-7}$ A/V |

Figure 2:
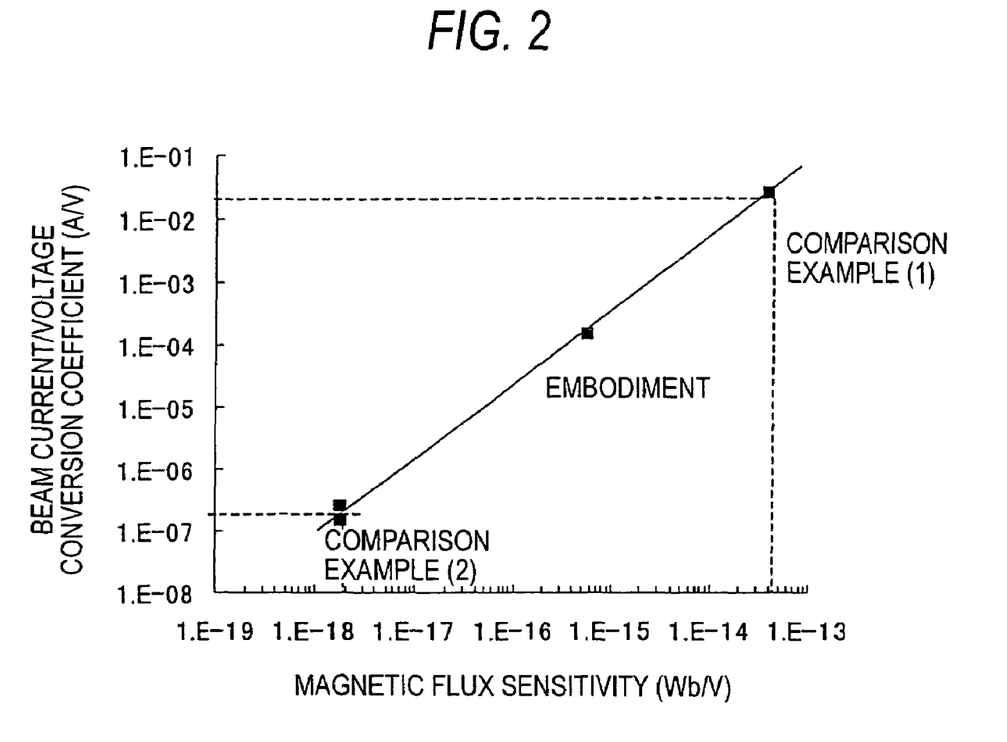
FIG. 2 shows the relationship between a magnetic flux sensitivity and a beam current/voltage conversion coefficient.

FIG. 2 shows a relationship curve between the magnetic flux sensitivity and the beam current/voltage conversion coefficient. From FIG. 2, it is understood that the magnetic flux sensitivity is proportional to the beam current/voltage conversion coefficient. The noise width can be reduced to 2 mV from a general noise width of electronic apparatus and Comparison Example 1. For the noise width of 1 mV to become equivalent to 10 μA requires a beam current/voltage conversion coefficient of $5 \times 10^{-13}$ A/V.

From this finding and the above proportional relationship, the condition a beam current can be measured nondestructively with a noise width of 10 μA would be a magnetic flux sensitivity of $5 \times 10^{-15}$ Wb/V or below. This condition must be satisfied to solve the problem. The higher the magnetic flux is, the smaller the apparent noise width becomes.

As the sensitivity gets higher, the noise immunity drops. In particular, pulse-shaped external noise is likely to unlock the SQUID. A desirable magnetic flux sensitivity would be $2 \times 10^{-18}$ Wb/V or above to attain stable measurements.

In this way, in order to keep measurements stable and maintain the noise width equivalent to several microamperes or below, a magnetic flux sensitivity from $2 \times 10^{-18}$ Wb/V to $5 \times 10^{-15}$ Wb/V inclusive is desirable.

Figure 3:
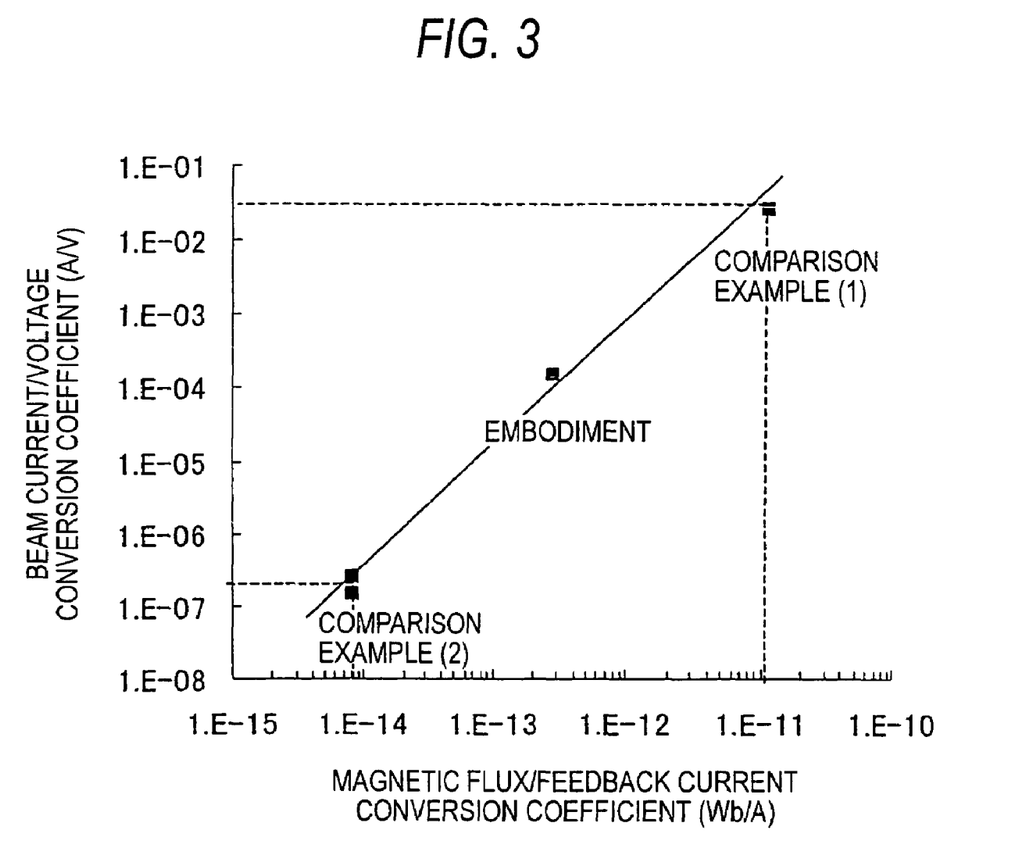
FIG. 3 shows the relationship between a magnetic flux/feedback current conversion coefficient and a beam current/voltage conversion coefficient.

FIG. 3 shows a relationship curve between the magnetic flux/feedback current conversion coefficient and the beam current/voltage conversion coefficient. From FIG. 3, it is understood that the magnetic flux/feedback current conversion coefficient is proportional to the beam current/voltage conversion coefficient.

Same as the above description on the magnetic flux sensitivity, in order to keep measurements stable and maintain the noise width equivalent to 10 μA or below, a magnetic flux/feedback current conversion coefficient from $8 \times 10^{-15}$ Wb/A to $2 \times 10^{-12}$ Wb/V inclusive is desirable.

More desirably, the condition a beam current can be measured nondestructively with a noise width of several microamperes would be a magnetic flux/feedback current conversion coefficient of $1 \times 10^{-12}$ Wb/A or below and a magnetic flux sensitivity of $2 \times 10^{-15}$ Wb/V or below.

While the invention has been described in detail referring to specific embodiments, those skilled in the art will recognize that various changes and modifications can be made in it without departing from the spirit and scope thereof.

This application is based on the Japanese Patent Application No. 2003-71028 and its contents are herein incorporated in its entirety as a reference.

INDUSTRIAL APPLICABILITY

As mentioned above, according to the invention, it is possible to provide beam current measuring apparatus featuring a high noise immunity, a high sensitivity and easy handling. The invention is applicable to beam current control apparatus, exposure apparatus using the same or the like.

The invention claimed is:

1. Beam current measuring apparatus comprising: a magnetism shielding part for shielding an external magnetic field; and a magnetic field sensor arranged in the shielding space generated by said magnetism shielding part, said beam current measuring apparatus measuring, by using said magnetic field sensor, a magnetic field where a beam current to be measured is generated, wherein said magnetic field sensor has a magnetic flux/feedback current conversion coefficient of 8×10–15 Wb/A or above the magnetic flux/feedback current conversion coefficient representing a ratio of a feedback current flowing to a feedback coil with respect to a change amount of magnetic flux passing through the magnetic field sensor.

2. The beam current measuring apparatus according to claim 1, wherein said magnetic field sensor has a magnetic flux/feedback current conversion coefficient of 2×10–12 Wb/A or below.

3. The beam current measuring apparatus according to claim 1, wherein said magnetic field sensor has a magnetic flux/feedback current conversion coefficient of 1×10–12 Wb/A or below.

4. Beam current measuring apparatus comprising: a magnetism shielding part for shielding an external magnetic field wherein the magnetism shielding part comprises a gap that receives the magnetic field; and a magnetic field sensor arranged in the shielding space generated by said magnetism shielding part, said beam current measuring apparatus measuring, by using said magnetic field sensor, a magnetic field where a beam current to be measured is generated, wherein said magnetic field sensor has a magnetic flux sensitivity of 2×10–18 Wb/V or above.

5. The beam current measuring apparatus according to claim 4, wherein said magnetic field sensor has magnetic flux sensitivity of 5×10–15 Wb/V or below.

6. The beam current measuring apparatus according to claim 4, wherein said magnetic field sensor has a magnetic flux sensitivity of 2×10–15 Wb/V or below.

7. The beam current measuring apparatus according to claim 1, wherein said magnetic field sensor is a SQUID.

8. The beam current measuring apparatus according to claim 1, wherein said magnetic field sensor is a high-temperature superconducting SQUID.

9. The beam current measuring apparatus according to claim 1, wherein said magnetic field sensor comprises a magnetism shielding part for magnetically shielding from an external magnetic field a sensor part that senses magnetic flux to be measured.

10. The beam current measuring apparatus according to claim 9, wherein said magnetism shielding part comprises a superconductor.

11. The beam current measuring apparatus according to claim 9, wherein said magnetism shielding part comprises a high-temperature superconductor.

12. The beam current measuring apparatus according to claim 10, wherein said magnetism shielding part comprises a gap.

13. The beam current measuring apparatus according to claim 1, wherein said magnetic field sensor comprises an electric field shielding part for shielding from an external electric field a sensor part that senses magnetic flux to be measured.

14. The beam current measuring apparatus according to claim 1, wherein said magnetism sensor comprises a mechanism for collecting a magnetic field generated by a beam current to be measured.

15. The beam current measuring apparatus according to claim 14, wherein said mechanism for collecting a magnetic field is a coil including a superconducting wire wound around a core of a soft magnetic material or a cylinder whose surface is coated with a high-temperature superconductor and whose outer periphery has a bridge part partially including a high-temperature superconductor.

16. A beam current measuring method using the beam current measuring apparatus according to claim 1, comprising the step of: arranging a magnetic field sensor of said beam current measuring apparatus on a beam line irradiated from an ion source or an electron ray source onto the surface of a processed substance in order to measure the beam current value of said beam line from the output of said magnetic field sensor.

17. A beam irradiation method comprising a measuring step of measuring, by using the beam current measuring method according to claim 16, a beam current of a beam generated using an ion source or an electron ray source, a control step of feeding back said beam current value obtained in said measuring step to the control parameter of said ion source or electron ray source, and an irradiating step of irradiating a beam current onto a processed substance, said beam current controlled using the control parameter obtained in said control step.

18. Beam irradiation apparatus comprising the beam current measuring apparatus according to claim 1.

19. A processed substance manufactured using ion implantation apparatus, electron beam exposure apparatus or accelerating apparatus comprising the beam current measuring apparatus according to claim 1.

* * * * *

UNITED STATES PATENT AND TRADEMARK OFFICE
CERTIFICATE OF CORRECTION

PATENT NO.      : 7,619,223 B2                                    Page 1 of 1
APPLICATION NO. : 10/549251
DATED           : November 17, 2009
INVENTOR(S)     : Sasaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 811 days.

Signed and Sealed this

Twenty-sixth Day of October, 2010

David J. Kappos
*Director of the United States Patent and Trademark Office*